(12) United States Patent
Kulkarni et al.

(10) Patent No.: US 8,847,633 B1
(45) Date of Patent: Sep. 30, 2014

(54) LOW VOLTAGE SWING REPEATER

(71) Applicants: Jaydeep P. Kulkarni, Hillsboro, OR (US); Dinesh Somasekhar, Portland, OR (US)

(72) Inventors: Jaydeep P. Kulkarni, Hillsboro, OR (US); Dinesh Somasekhar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 15 days.

(21) Appl. No.: 13/791,103

(22) Filed: Mar. 8, 2013

(51) Int. Cl.
*H03K 3/00* (2006.01)

(52) U.S. Cl.
USPC .......................................................... 327/108

(58) Field of Classification Search
None
See application file for complete search history.

(56) References Cited

U.S. PATENT DOCUMENTS

| | | | | |
|---|---|---|---|---|
| 7,592,839 | B2 * | 9/2009 | Masleid et al. | 326/86 |
| 7,679,395 | B1 * | 3/2010 | Yang et al. | 326/27 |
| 7,705,633 | B2 * | 4/2010 | Pitkethly | 326/87 |
| 7,746,113 | B1 * | 6/2010 | Young | 326/68 |
| 8,022,731 | B2 * | 9/2011 | Pitkethly | 326/87 |
| 8,242,811 | B2 * | 8/2012 | Seo et al. | 327/109 |
| 8,436,660 | B2 * | 5/2013 | Boecker | 327/108 |
| 8,629,705 | B2 * | 1/2014 | Chang et al. | 327/333 |
| 2002/0060587 | A1 * | 5/2002 | Kimball et al. | 327/108 |
| 2005/0232010 | A1 | 10/2005 | Cernea | |
| 2005/0264320 | A1 * | 12/2005 | Chan et al. | 326/83 |
| 2007/0008004 | A1 * | 1/2007 | Santurkar et al. | 326/82 |
| 2007/0296461 | A1 * | 12/2007 | Wong et al. | 326/82 |
| 2008/0001630 | A1 * | 1/2008 | Phang et al. | 326/82 |
| 2009/0116307 | A1 | 5/2009 | Cottier et al. | |
| 2010/0164556 | A1 * | 7/2010 | Masleid | 327/108 |
| 2011/0075491 | A1 | 3/2011 | Yun et al. | |
| 2011/0133772 | A1 * | 6/2011 | Shau | 326/30 |
| 2011/0285423 | A1 * | 11/2011 | Whetsel | 326/82 |
| 2012/0032702 | A1 * | 2/2012 | Lee et al. | 326/81 |
| 2012/0262205 | A1 * | 10/2012 | Nishi | 327/108 |
| 2013/0187699 | A1 * | 7/2013 | Slezak | 327/333 |

OTHER PUBLICATIONS

Garcia, Jose C., et al., "High Performance Bootstrapped CMOS Low to High-Swing Level-Converter for On-Chip Interconnects", *18th European Conference on Circuit Theory and Design*, pp. 795-798, 2007, pp. 795-798.

(Continued)

*Primary Examiner* — Lincoln Donovan
*Assistant Examiner* — Khareem E Almo
(74) *Attorney, Agent, or Firm* — Blakely, Sokoloff, Taylor & Zafman LLP

(57) ABSTRACT

Described is an integrated circuit (IC) which comprises: a first driver having stacked devices, the first driver operable on a first power supply and a first ground supply, the first driver to receive an input signal with a signal swing according to a second power supply and a second ground supply, the second power supply having a voltage level lower than a voltage level of the first power supply, and the second ground supply having a voltage level higher than a voltage level of the first ground supply; a second driver coupled to the first driver, the second driver operable on the second power supply and the second ground supply; and a pair of by-pass devices coupled to the first and second drivers, the pair of by-pass devices to provide the second power supply and the second ground supply according to an output of the first driver.

20 Claims, 8 Drawing Sheets

(56) References Cited

OTHER PUBLICATIONS

Shrivastava, Aatmesh, et al., "A Charge Pump Based Receiver Circuit for Voltage Scaled Interconnect", *International Symposium on Low Power Electronics and Design*, pp. 327-332, 2012, pp. 327-332.

Zhang, Hui, et al., "Low-Swing On-Chip Signaling Techniques: Effectiveness and Robustness", *IEEE Transactions on Very Large Scale Integration (VLSI) Systems*, vol. 8, No. 3, Jun. 2000, pp. 264-272.

Notification of Transmittal of the International Search Report and the Written Opinion of the International Searching Authority issued for International Patent Application No. PCT/US2012/071714, mailed Sep. 12, 2013.

* cited by examiner

300

320

330

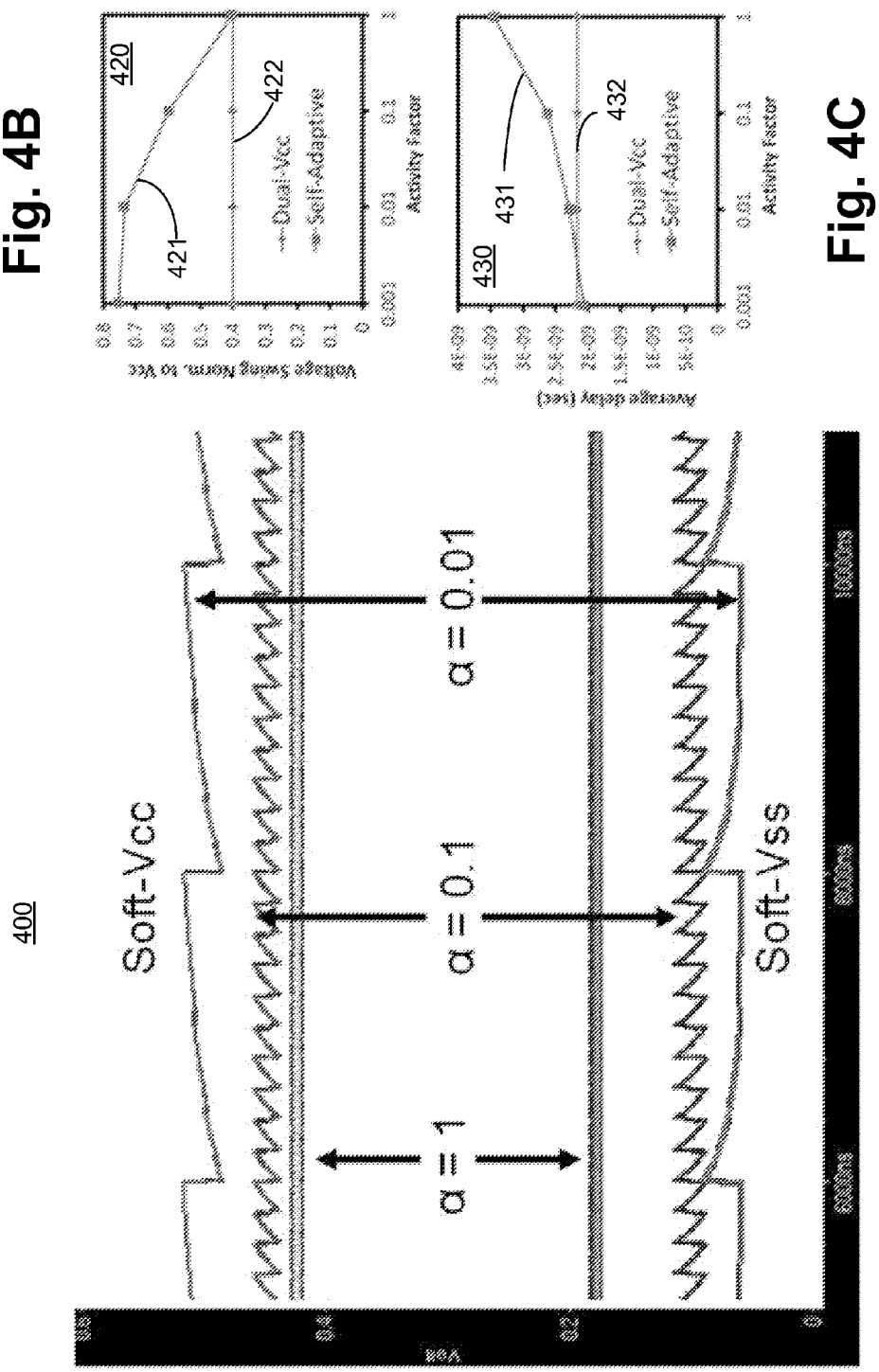

LOW VOLTAGE SWING REPEATER

BACKGROUND

Low swing signaling is an effective technique to reduce power consumption on interconnects (e.g., clock distribution networks, busses, etc.). FIG. 1 shows a generic view of a low swing voltage signaling scheme 100 for interconnects. Low swing voltage signaling scheme 100 comprises multiple repeaters (Repeater-1, Repeater-2, and Repeater-3) which drive the signal "Input" over multiple interconnects to generate signal "Output."

At the transmitter end of interconnect line 102, a high-swing to low-swing driver 101 (Repeater-1) reduces the voltage range of Vcc-Hi to Vss-Hi to the low-swing voltage range of Vcc-Lo to Vss-Lo. High-swing to low-swing driver 101 consists of a first inverter having p-type transistor $P_1$ coupled to n-type transistor $N_1$, where $P_1$ is coupled to Vcc-Hi and $N_1$ is coupled to Vss-Hi. High-swing to low-swing driver 101 further consists of a second inverter having p-type transistor $P_2$ coupled to n-type transistor $N_2$, where $P_2$ is coupled to Vcc-Lo and $N_2$ is coupled to Vss-Lo. Vcc-Lo and Vss-Lo have power supply levels which are between Vcc-Hi and Vss-Hi power supply levels. At the receiver end, a level-restoration circuit (such as capacitive coupled boosting, charge pump based boosting, etc.) is used to minimize the static current consumption.

Repeater-2 and Repeater-3 are similar to Repeater-1, and each uses multi-supplies to operate this low swing signal transmission architecture. Repeater-2 consists of two inverters—the first inverter having transistors $P_3$ and $N_3$ and operating on Vcc-Hi and Vss-Hi supplies, while the second inverter consists of transistors $P_4$ and $N_4$ and operating on lower voltage range using Vcc-Lo and Vss-Lo. Repeater-3 consists of two inverters—the first inverter having transistors $P_5$ and $N_5$ and operating on Vcc-Hi and Vs s-Hi supplies, while the second inverter consists of transistors $P_6$ and $N_6$ and operating on lower voltage range using Vcc-Lo and Vss-Lo.

The static current consumption increases sharply if the difference between Vcc-Hi and Vcc-Lo or between Vss-Hi and Vss-Lo is higher than a threshold voltage (Vt). The voltage swing of signal on interconnect 102 is independent of the activity factor of input signal "Input." Low voltage swing signaling scheme 100 requires two separate voltage supplies or second supply generation circuits (such as a charge pump or low-drop out regulators) to provide Vcc-Hi, Vcc-Lo, Vss-Hi, and Vss-Lo power supplies.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 4A-C illustrate activity factor adaptive voltage swing of the low voltage swing repeater circuit, according to one embodiment of the disclosure.

DETAILED DESCRIPTION

Figure 1:
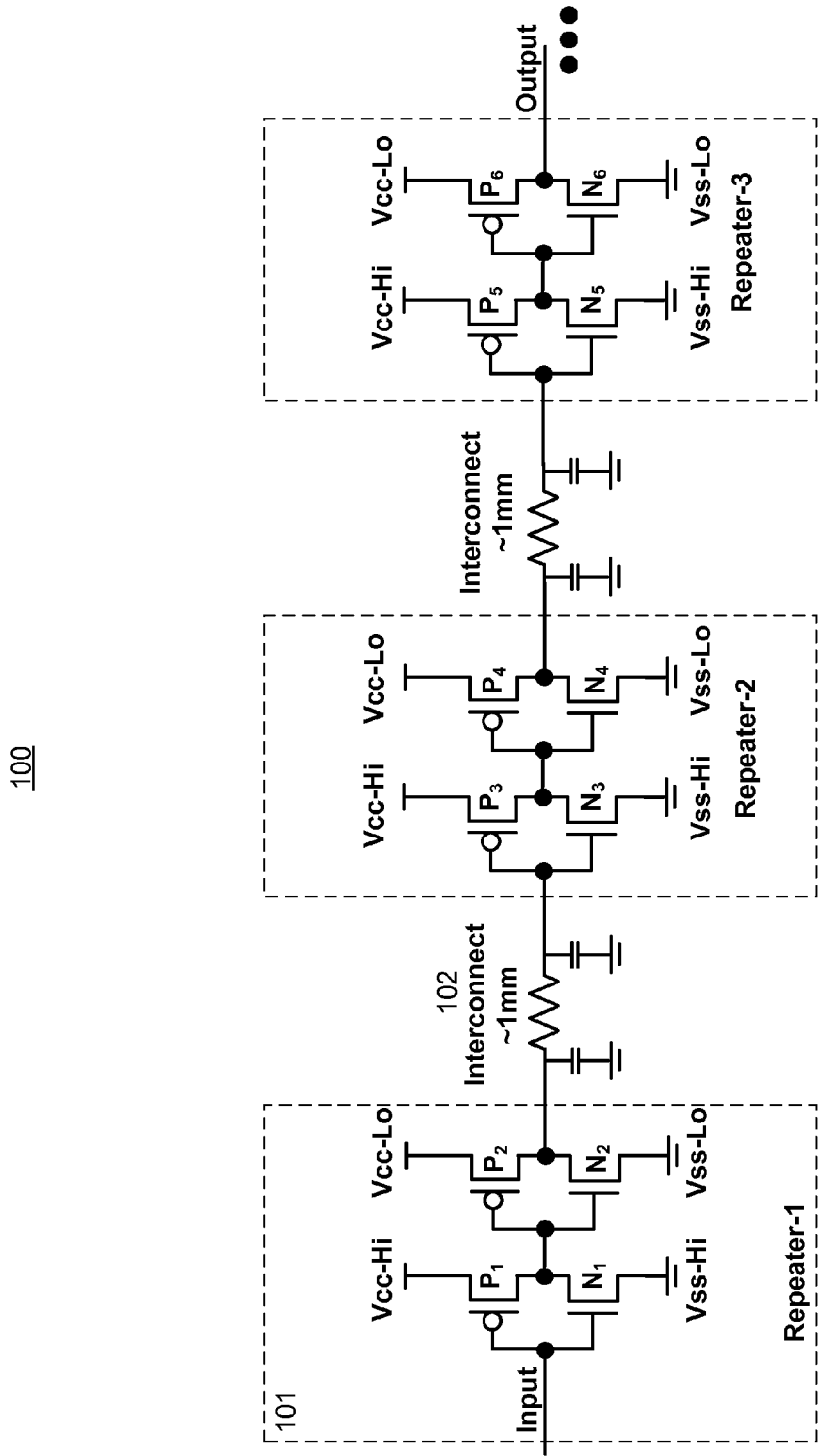
FIG. 1 shows a generic view of a low voltage swing signaling scheme for interconnects.

The embodiments describe a low voltage swing repeater with activity factor adaptive voltage swing modulation that does not require additional voltage supplies as required by the repeater architecture of FIG. 1. In one embodiment, the low swing repeater uses a single power supply to generate a low voltage swing signal which is transmitted over interconnects. In one embodiment, the voltage swing of the signal being transmitted over interconnect is self-adaptive to input data transition activity. For example, the higher the input data transition activity, the lower is the signal swing of the signal being transmitted over interconnect. A lower swing signal translates to lower power consumption. In one embodiment, the low voltage swing repeater results in lower propagation delay of the signal compared to the multi-supply repeater architecture of FIG. 1.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 2A:
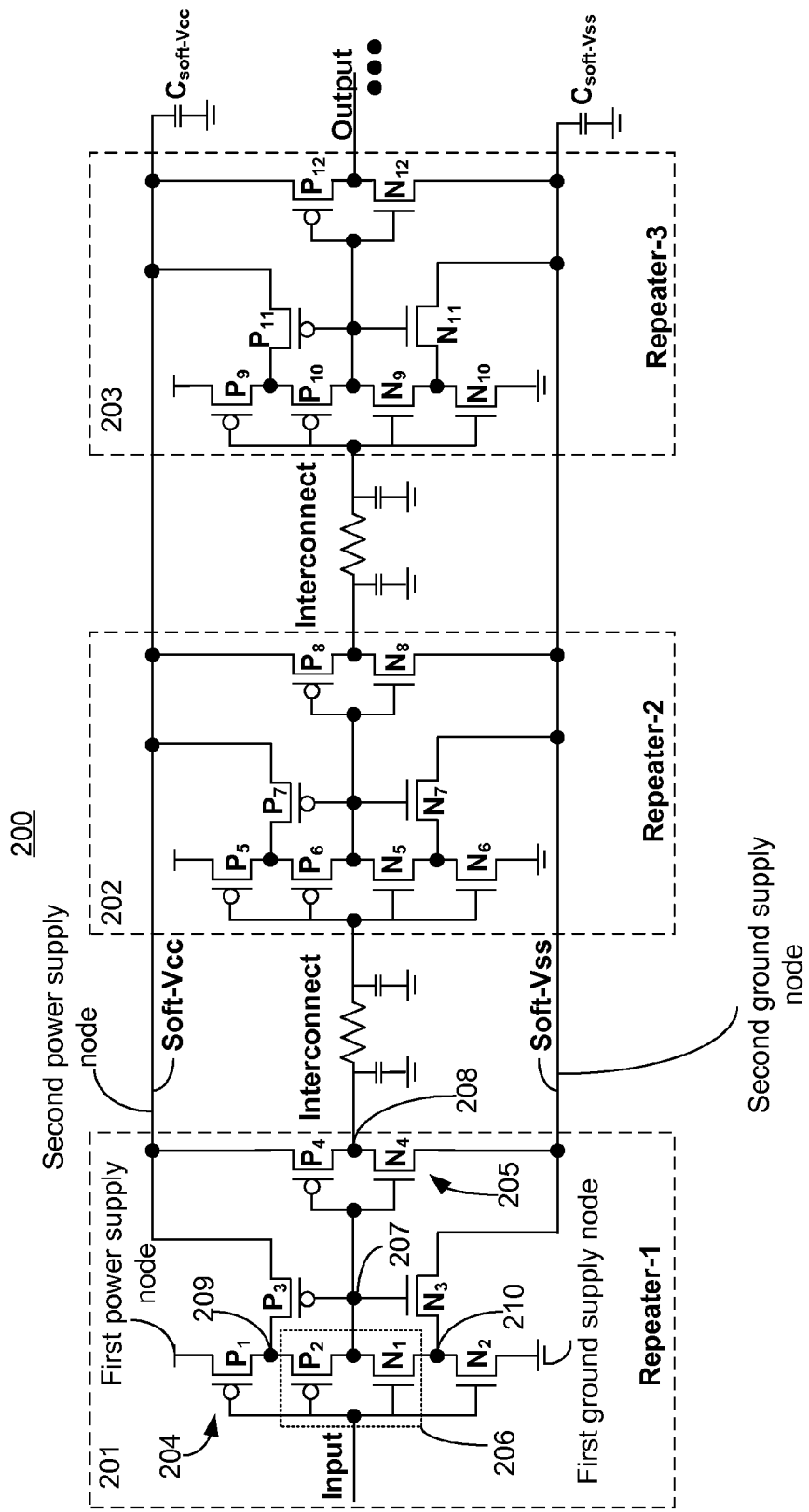
FIGS. 2A-C is a low voltage swing repeater circuit, according to some embodiments of the disclosure.

FIG. 2A low voltage swing repeater circuit architecture 200, according to one embodiment of the disclosure. In one embodiment, low voltage swing repeater circuit architecture 200 comprises multiple repeaters including Repeater-1 201, Repeater-2 202, and Repeater-3 203, and interconnects, where Repeater-1 201 receives an input signal at node Input and Repeater-3 203 generates the final Output. So as not to obscure the embodiments, three repeaters are shown. However, any number of repeaters may be used to improve drive strength of the signal driven over long interconnects. Interconnects are modeled as Pi model of resistors and capacitors. Other models for interconnects can be used without changing the essence of the embodiments. So as not to obscure the embodiments, Repeater-1 201 is discussed in detail. The same discussion is applicable to other Repeaters, i.e., Repeater-2 202 and Repeater-3 203.

In one embodiment, Repeater-1 201 comprises a first driver 204 coupled to a first power supply node (e.g., Vcc) and a first ground node (e.g., Vss). In one embodiment, the first driver 204 has a first input node (Input) and a first output node 207. In one embodiment, the first power supply node carries a first power supply and the first ground node carries a first ground supply. In one embodiment, Repeater-1 201 further comprises a second driver 205 coupled to first driver 204. In one embodiment, second driver 205 has a second input node 207 coupled to first output node 207 (same as second input node), and a second output node 208 coupled to interconnect.

In one embodiment, Repeater-1 201 comprises a first bypass device $P_3$ (also called current by-pass p-type device) coupled to first output node 207 and an internal node 209 of first driver 204. In one embodiment, first bypass device $P_3$ provides a second power supply (e.g., Soft-Vcc) on a second power supply node coupled to second driver 205. In one embodiment, the second power supply is lower than the first power supply.

In one embodiment, Repeater-1 201 comprises a second bypass device $N_3$ coupled to first output node 207 and another internal node 210 of first driver 204. In one embodiment, second bypass device $N_3$ provides a second ground supply (e.g., Soft-Vss) on a ground supply node coupled to second driver 205. In one embodiment, second bypass device $N_3$ is an n-type device. In one embodiment, the second ground supply is higher than the first ground supply. In this embodiment, second power supply (Soft-Vcc) and second ground supply (e.g., Soft-Vss) have voltage levels which are within the voltage envelope of first power supply (e.g., Vcc) and first ground supply (e.g., Vss).

In one embodiment, first driver 204 comprises a first p-type device $P_1$ coupled to the first power supply node, internal node 209, and first input node (Input). In one embodiment, first driver 204 comprises a first n-type device $N_2$ coupled to the first ground node, the other internal node 210, and the first input node (Input). In one embodiment, first driver 204 comprises a logic gate 206 coupled to the internal node 209, the other internal node 210, the input node (Input), and the output node 207. In one embodiment, logic gate 206 is an inverter comprising a p-type device $P_2$ and an n-type device $N_1$ coupled together as shown. In another embodiment, logic gate 206 is a complex gate (e.g., a NAND gate, a NOR gate, etc.).

In one embodiment, second driver 205 comprises a second p-type device $P_4$ coupled to the second input node 207, interconnect (beginning at node 208), and the second power supply node. In one embodiment, second driver 205 comprises a second n-type device $N_4$ coupled to second input node 207, interconnect (beginning at node 208), and the second ground node. So as not to obscure the embodiments, the term "node" and signal on the node are interchangeably used. For example, second power supply node is also referred as Soft-Vcc which is the power supply on the second power supply node, and visa-versa.

Like Repeater-1 201, in one embodiment, Repeater-2 202 is coupled to interconnect and receives output signal driven by Repeater-1. In one embodiment, Repeater-2 202 comprises a first driver (with p-type devices $P_5$ and $P_6$, n-type devices $N_5$ and $N_6$) coupled to a second driver (with p-type device Pg and n-type device $N_8$), and current by-pass p-type device $P_7$ and current by-pass n-type device $N_7$ to provide second power supply and second ground supply to the second driver of Repeater-2 202 respectively.

Like Repeater-1 201, in one embodiment, Repeater-3 203 is coupled to interconnect and receives output signal driven by Repeater-2. In one embodiment, Repeater-3 203 comprises a first driver (with p-type devices $P_9$ and $P_{10}$, and n-type device $N_9$ and $N_{10}$) coupled to a second driver (with p-type device $P_{12}$ and n-type device $N_{12}$), and current by-pass p-type device $P_{11}$ and current by-pass n-type device $N_{11}$ to provide second power supply and second ground supply to the second driver of Repeater-3 203 respectively.

In one embodiment, charge stored on Soft-Vcc and Soft-Vss powers the second driver 205. In one embodiment, voltage level of Soft-Vcc rises via $P_3$ within a threshold voltage of $P_1$. In one embodiment, voltage level of Soft-Vss sinks via $N_3$ within a threshold voltage of $N_2$. In one embodiment, when Input is at Soft-Vcc voltage level (assuming Input receives a signal driven from another repeater similar to Repeater-1 201), then $P_1$ and $P_2$ are on which causes first output node 207 to be logical one (same as first power supply level). A logical one on first output node 207 causes $P_3$ to turn off, which causes second power supply node to retain its previous value.

In this embodiment, $N_3$ is turned on which causes node 210 to have voltage level of second ground supply, i.e., Soft-Vss. Since, node 210 is at Soft-Vss level and Input is at Soft-Vss level, N1 is completely turned off (because its Vgs is negative, gate at zero volts and source at Soft-Vss, and less than its threshold voltage). Unlike the embodiment of FIG. 1, there is no (or substantially zero) current path to ground because $N_1$ is completely off. In this embodiment, $N_2$ is turned off because Vgs of $N_2$ is zero (gate at 0 and source at Vss). The leakage current through $N_2$ pulls voltage on Soft-Vss down towards first ground supply level.

A similar complementary analysis with Input node being at Soft-Vcc voltage level causes voltage level of Soft-Vcc (Second power supply) to rise via $P_3$ and the leakage current through $P_1$ (where $P_2$ is completely off). Voltage level of Soft-Vcc rises within a threshold voltage of $P_1$. The embodiments accordingly generate Soft-Vcc which is lower in voltage level than the first power supply, and Soft-Vss which is higher in voltage level than the first ground supply.

In this embodiment, second driver 205 generates a signal on node 208 with a signal voltage swing which is lower than the signal voltage swing of the signal on node 207. A lower signal voltage swing on node 208 reduces power supply of the repeater architecture 200 without having to provide a dedicated second power supply. In one embodiment, capacitor $C_{soft\text{-}Vcc}$ is coupled to Second power supply node to reduce noise on that node. In one embodiment, capacitor $C_{soft\text{-}Vss}$ is coupled to Second ground supply node to reduce noise on that node. In one embodiment, capacitors $C_{soft\text{-}Vcc}$ and $C_{soft\text{-}Vss}$ may result from a sparse Soft-Vcc or Soft-Vss power grid across multiple repeaters.

In one embodiment, during rising and falling input transitions of an input signal at Input node, charge distribution occurs on nodes 207, 209, 210, second power supply node, and second ground supply node. As data activity increases (i.e., increase in frequency of rising and falling input transitions of the input signal), the charge distribution to and/or from second power supply node (Soft-Vcc) and second ground supply node (Soft-Vss) increases causing the signal swing of signal on node 208 to lower.

Figure 2B:
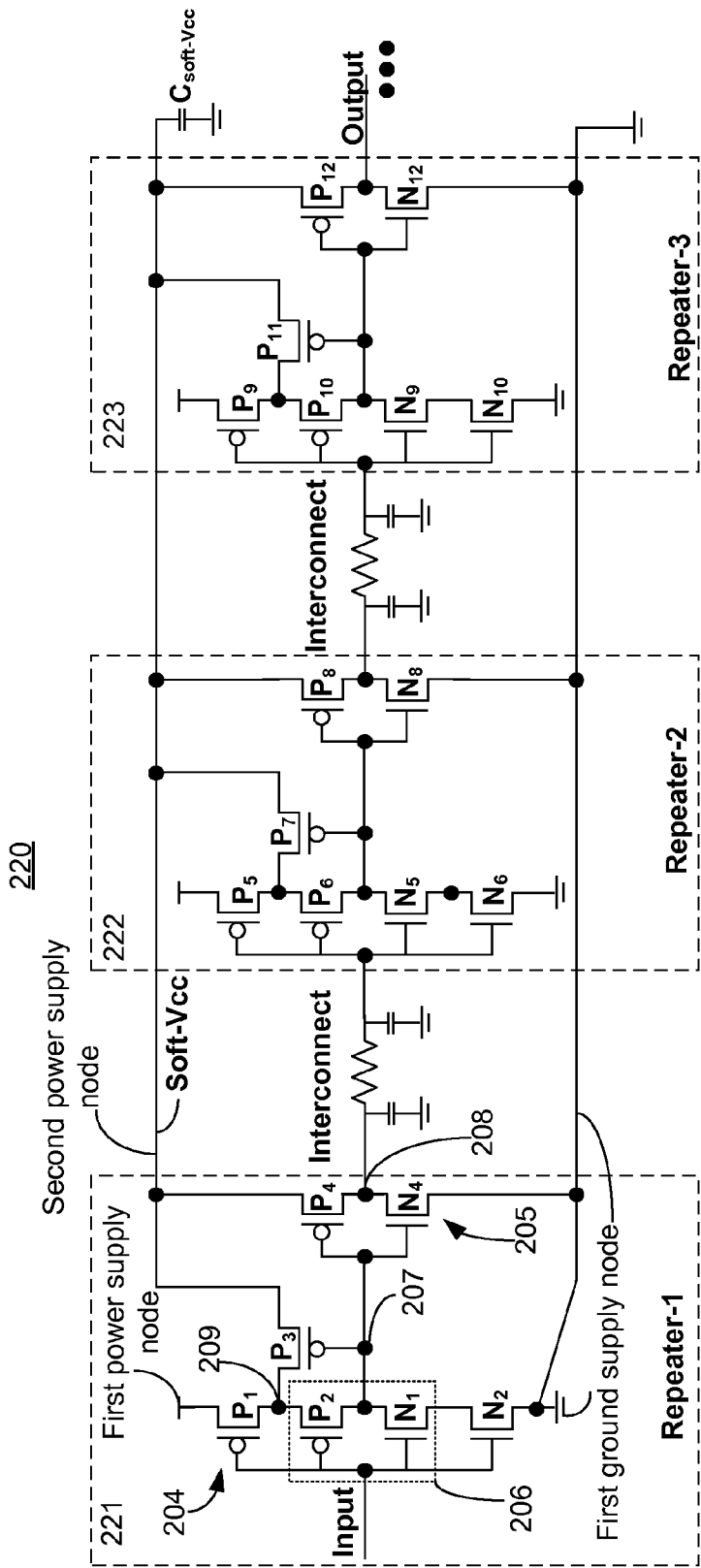

FIG. 2B low voltage swing repeater circuit architecture 220, according to another embodiment of the disclosure. It is pointed out that those elements of FIG. 2B having the same reference numbers (or names) as the elements of any other figure can operate or function in any manner similar to that described, but are not limited to such.

So as not to obscure the embodiments of the disclosure, differences between FIG. 2B and FIG. 2A are discussed. In one embodiment, Repeater-1 221 is similar to Repeater-1 201 but uses a p-type bypass device $P_3$ only instead of both the p-type and n-type bypass devices ($P_3$ and $N_3$) of Repeater-1 201. Repeater-2 222 and Repeater-3 223 have similar circuits as Repeater-1 221. In such an embodiment, Soft-Vss node of FIG. 2A is the same as first ground supply node. In this embodiment, low voltage swing at output 208 is achieved by Soft-Vcc which has a voltage level lower than voltage level of first power supply. The adaptive behavior of Repeater-1 201 is also observed by Repeater-1 221.

Figure 2C:
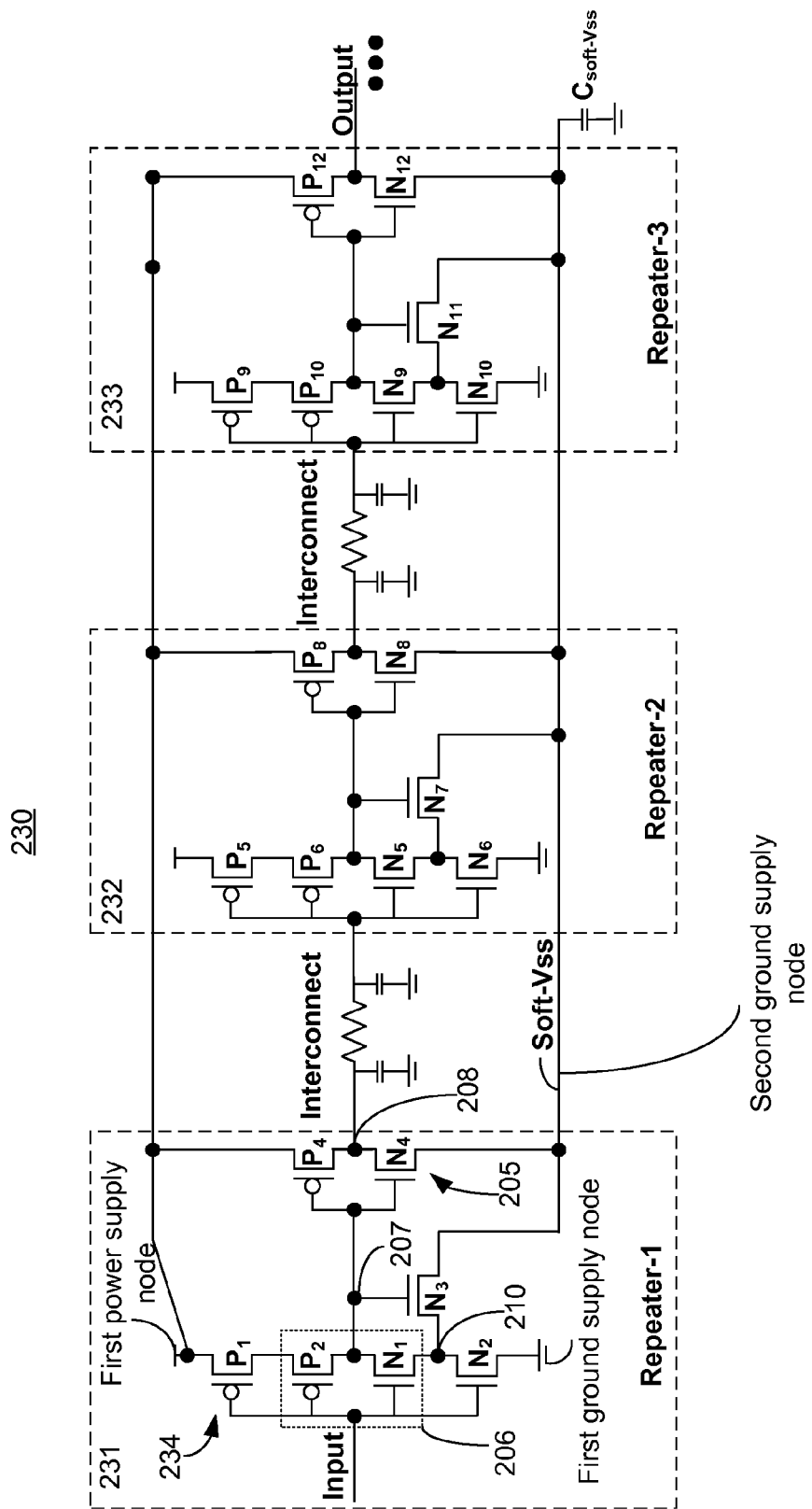

FIG. 2C low voltage swing repeater circuit architecture 230, according to another embodiment of the disclosure. It is pointed out that those elements of FIG. 2C having the same reference numbers (or names) as the elements of any other figure can operate or function in any manner similar to that described, but are not limited to such.

So as not to obscure the embodiments of the disclosure, differences between FIG. 2C and FIG. 2A are discussed. In one embodiment, Repeater-1 231 is similar to Repeater-1 201 but uses an n-type bypass device $N_3$ only instead of both the p-type and n-type bypass devices ($P_3$ and $N_3$) of Repeater-1 201. Repeater-2 232 and Repeater-3 233 have similar circuits as Repeater-1 231. In such an embodiment, Soft-Vcc node of FIG. 2A is the same as first power supply node. In this embodiment, low voltage swing at the output 208 is achieved by Soft-Vss which has a voltage level higher than voltage level of first ground supply. The adaptive behavior of Repeater-1 201 is also observed by Repeater-1 231.

Figures 3A, 3B, 3C:
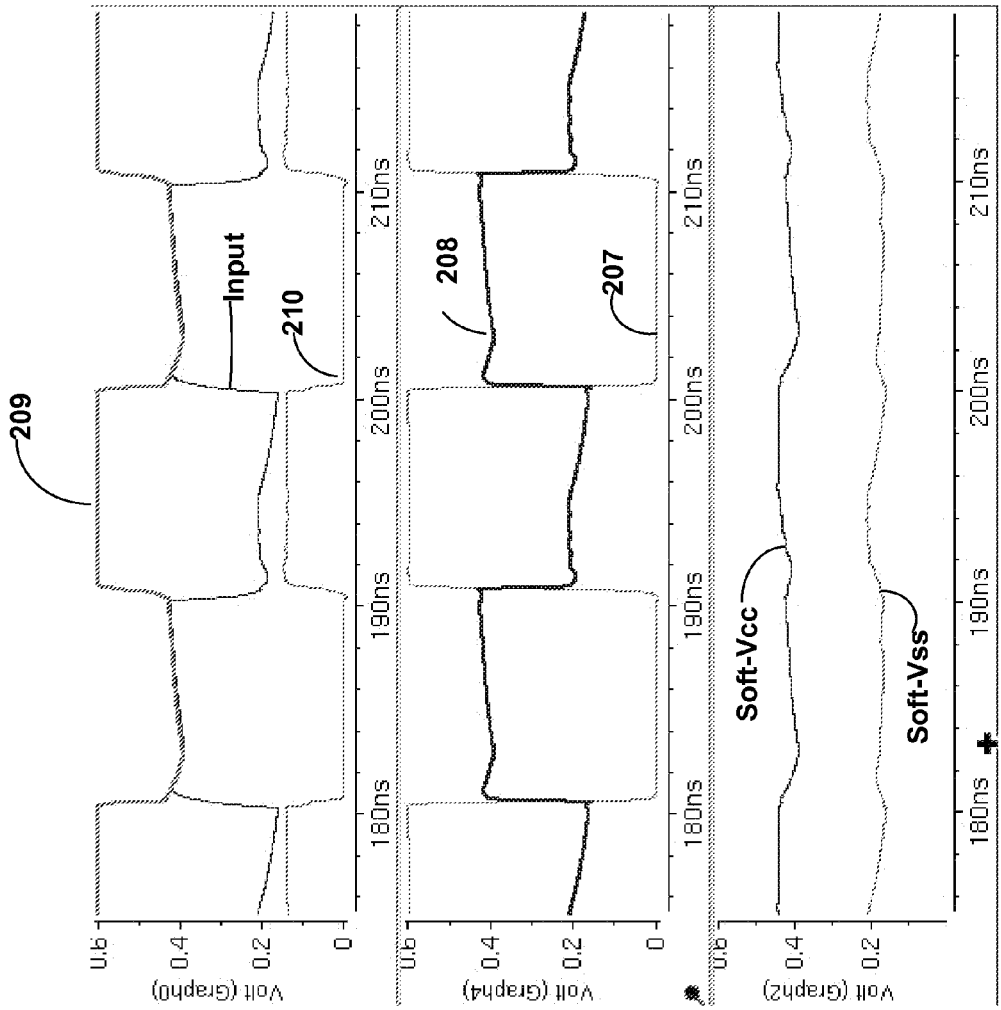
FIGS. 3A-C illustrate transient behavior of various nodes of the low voltage swing repeater circuit, according to one embodiment of the disclosure.

FIGS. 3A-C illustrate transient behavior of various nodes of the low voltage swing repeater circuit (e.g., Repeater-1 201), according to one embodiment of the disclosure. It is pointed out that those elements of FIGS. 3A-C having the same reference numbers (or names) as the elements of any other figure can operate or function in any manner similar to that described, but are not limited to such.

FIG. 3A is a plot 300 with three waveforms indicating voltages on node Input node, 209, and 210. The x-axis is time while the y-axis is voltage. In this example, first power supply level is 0.6V and first ground supply level is 0V. As Input transitions from logical zero (around 0.2V) to logical one (around 0.4V), voltage on node 209 reduces from 0.6V to 0.4V while voltage on node 210 reduces from near 0.2V to 0V. As later shown with reference to FIG. 3C, the logical low level of signal on node 209 determines Soft-Vcc while logical high of signal on node 210 determines Soft-Vss.

FIG. 3B is a plot 320 with two waveforms indicating voltages on node 207 and 208. The x-axis is time while the y-axis is voltage. The output of first driver 204 on node 207 has a voltage swing according to first power supply and first ground supply. The output of second driver 205 at node 208 is a low voltage swing signal according to second power supply (Soft-Vcc) and second ground supply (Soft-Vss). FIG. 3C is a plot 330 with two waveforms indicating average voltages on Second power supply node (Soft-Vcc) and Second ground supply node (Soft-Vss). The x-axis is time while the y-axis is voltage.

FIGS. 4A-C illustrate activity factor adaptive voltage swing of the low voltage swing repeater circuit, according to one embodiment of the disclosure. It is pointed out that those elements of FIGS. 4A-C having the same reference numbers (or names) as the elements of any other figure can operate or function in any manner similar to that described, but are not limited to such.

FIG. 4A illustrates a plot 400 indicating Soft-Vcc and Soft-Vss under three cases of input signal activity factors (a). The x-axis is time while the y-axis is voltage. Activity factor of 1 indicates a fastest (of the three) switching input signal on Input node. Activity factor of 0.01 indicates the slowest (of the three) switching input signal on Input node. Activity factor of 0.1 indicates a switching speed which is between the fastest and slowest switching speeds of input signal on Input node.

The term "switching" refers to toggling of input signal from logical high to logical low level. Plot 400 indicates that as activity factor of the input signal slows down, the voltage difference between Soft-Vcc and Soft-Vss increases. A larger difference between Soft-Vcc and Soft-Vss allows second driver 205 to have shorter propagation delay and higher voltage swing (which is still lower than the voltage swing of signal driven out on node 207 by first driver 204. For smaller activity factors, Soft-Vcc and Soft-Vss grids approach the Vcc (first power supply) and Vss (first ground supply) levels gradually due to slow charging of grid capacitors ($C_{soft\text{-}Vcc}$ and $C_{soft\text{-}Vss}$) due to leakage in $P_3$ and $N_3$.

FIG. 4B illustrates a plot 420 with two waveforms to compare voltage swing impact with change in activity factors of input signal for Repeater-1 201 and Repeater-1 101 of FIG. 1. The x-axis is activity factor while the y-axis is voltage swing normalized to Vcc (first power supply). Waveform 421 is the voltage swing of signal on node 208 driven by second driver 205. Waveform 422 is the voltage swing of signal driven by second driver (having p-type device $P_2$ and n-type device $N_2$) of Repeater-1 101 of FIG. 1. The voltage swing of the output of second driver of Repeater-1 101 is independent of input activity factor while the voltage swing of signal driven by second driver 205 of Repeater-1 201 of FIG. 2 is inversely proportional to the activity factor. Such adaptive voltage swing further allows for more power savings or higher performance at lower activity factors than the architecture 100 of FIG. 1.

FIG. 4C illustrates a plot 430 with two waveforms to compare propagation delay through the repeaters with change in activity factor of input signal for Repeater-1 201 and Repeater-1 101. The x-axis is activity factor while the y-axis is average delay (in seconds) from Input node to output node of the repeater. The delay in this example is measured at 50% of voltage swing mark of the signal on input node to the 50% of voltage swing mark of the signal on output node. Waveform 431 is the delay through Repeater-1 201. Waveform 432 is the delay through Repeater-1 101. The propagation delay through Repeater-1 201 is directly proportional to activity factor of signal at input node while propagation delay through Repeater-1 101 of FIG. 1 is independent of activity factor of signal at input node.

Figures 5A, 5B:
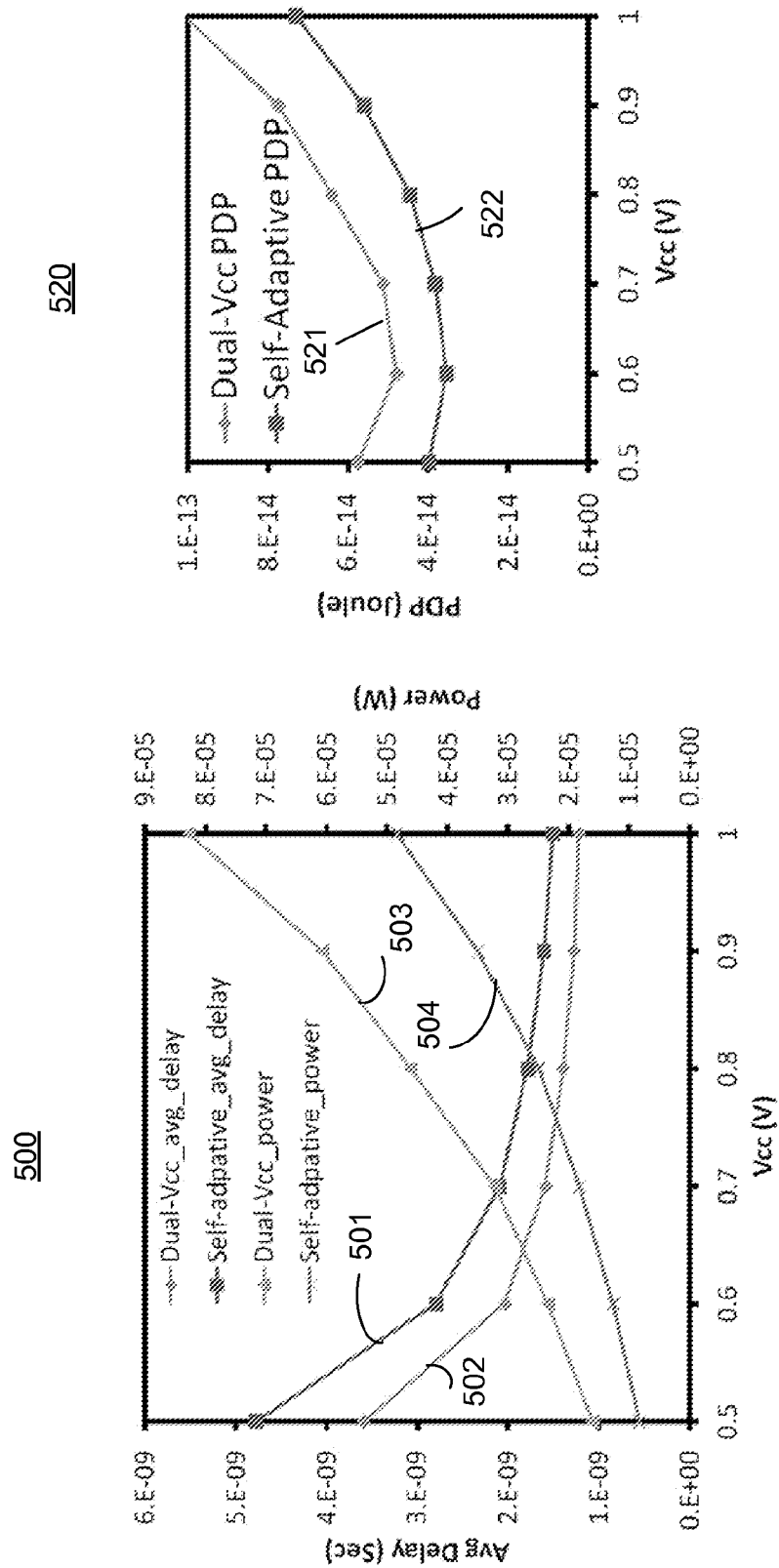
FIGS. 5A-B illustrate a comparison of average delay, power, and energy between low voltage swing signaling scheme of FIG. 1 and low swing repeater circuit of FIG. 2.

FIGS. 5A-B illustrate a comparison of average delay, power, and energy between low swing voltage signaling scheme of FIG. 1 and low swing repeater circuit of FIG. 2. It is pointed out that those elements of FIGS. 5A-B having the same reference numbers (or names) as the elements of any other figure can operate or function in any manner similar to that described, but are not limited to such.

FIG. 5A illustrates a plot 500 to compare the average delay and power between Repeater-1 101 of FIG. 1 and Repeater-1 201 of FIG. 2 at maximum activity (e.g., $\alpha=1$), according to one embodiment. The x-axis is first power supply Vcc. The y-axis to the left of plot 500 is average delay. The delay is (in seconds) from Input node to output node of the repeater. The delay in this example is measured at 50% of voltage swing mark of the signal on input node to the 50% of voltage swing mark of the signal on output node. The y-axis to the right of plot 500 is the power consumption in watts (W) consumed by the repeater. Waveform 501 is the average delay of Repeater-1 201. Waveform 502 is the average delay of Repeater-1 101. Waveform 503 is the power consumption of Repeater-1 101. Waveform 504 is the power consumption of Repeater-1 201.

FIG. 5B illustrates a plot 520 to compare energy (PDP—power delay product) between Repeater-1 101 of FIG. 1 and Repeater-1 201 of FIG. 2 at maximum activity, according to one embodiment. The x-axis is first power supply Vcc. The y-axis is energy (PDP—power delay product) in Joules. Waveform 521 indicates PDP for Repeater-1 101. Waveform 522 indicates PDP for Repeater-1 201.

Repeater-1 201 incurs higher delay due to stacked inverter in the first stage but results in lower power consumption compared to Repeater-1 101 of FIG. 1. In one embodiment, any leakage current through $P_3$ and $N_3$ devices is used to charge (discharge) Soft-Vcc (Soft-Vss) grid. Thus static leakage charge is stored onto the sparse grid capacitor ($C_{soft-Vcc}$ and $C_{soft-Vss}$) which is used for powering the driver inverter in the subsequent transitions resulting into lower PDP compared to Repeater-1 101 of FIG. 1. The self-adaptive swing from Repeater-1 201 of FIG. 2 achieves peak power reduction at high activity factor and higher speed at lower activity factor compared to Repeater-1 101 of FIG. 1.

Figure 6:
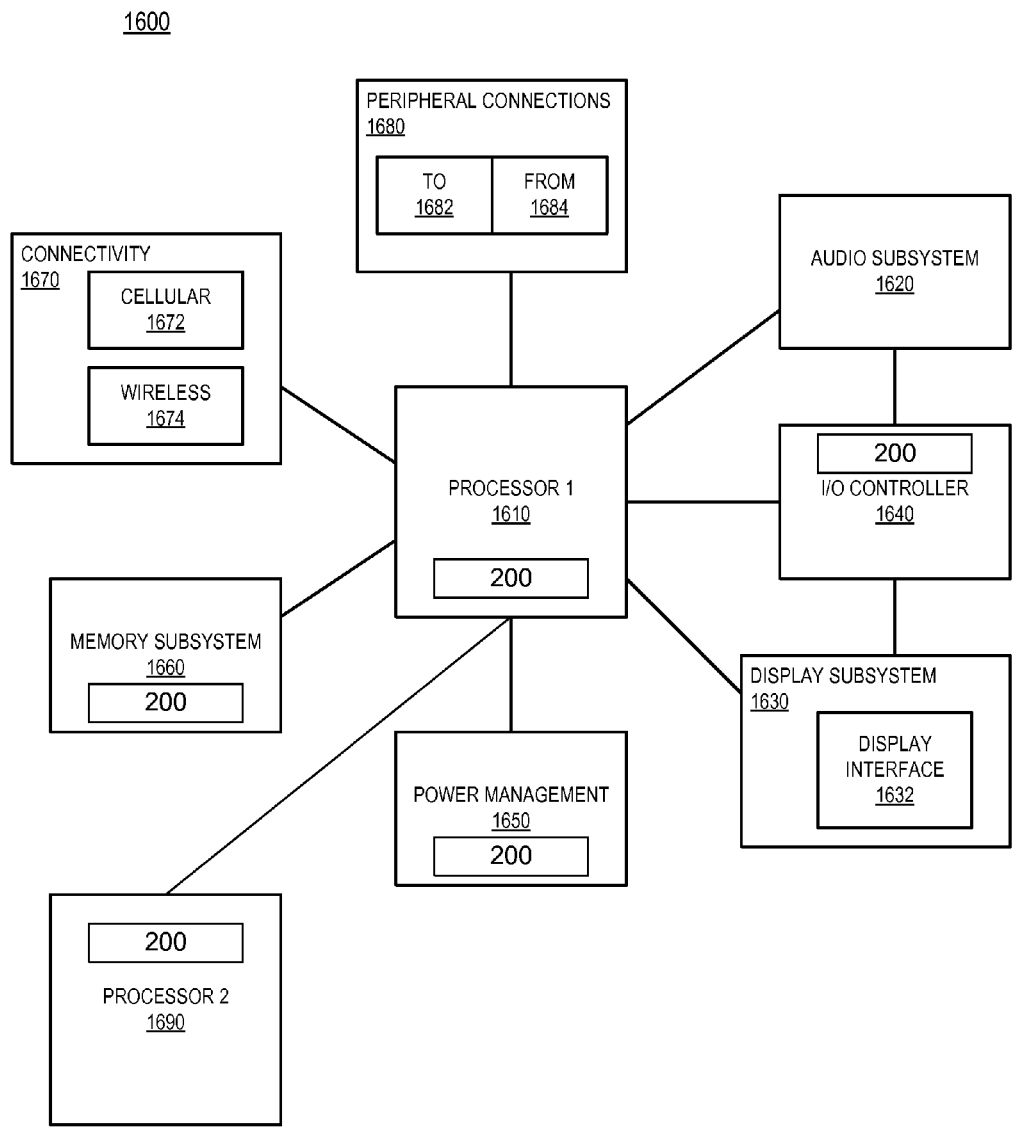
FIG. 6 is a smart device or a computer system or a SOC (system on chip) with low voltage swing repeater circuit, according to one embodiment of the disclosure.

FIG. 6 is a smart device or a computer system or a SOC (system on chip) with low voltage swing repeater circuit, according to one embodiment of the disclosure. FIG. 6 is a smart device or a computer system or a SOC with apparatus for radiation detector, according to one embodiment of the disclosure. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 (same as second processor 1690) with repeaters 200 such as Repeater-1 201, according to the embodiments discussed. Other blocks of the computing device 1600 may also include repeaters 200 such as Repeater-1 201. The various embodiments of the present disclosure may also comprise a network interface within 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it.

The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a first driver coupled to a first power supply node and a first ground node, the first driver having a first input node and a first output node, the first power supply node to have a first power supply and the first ground node to have a first ground supply; a second driver coupled to the first driver, the second driver having a second input node coupled to the first output node, and a second output node coupled to an interconnect; and a first bypass device coupled to the first output node and an internal node of the first driver, and to provide a second power supply on a second power supply node coupled to the second driver, the second power supply being lower than the first power supply.

In one embodiment, apparatus further comprises: a second bypass device coupled to the first output node and another internal node of the first driver, and to provide a second ground supply on a ground supply node coupled to the second driver, the second ground supply being higher than the first ground supply. In one embodiment, the second bypass device is an n-type device. In one embodiment, the first driver comprises: a first p-type device coupled to the first power supply node, the internal node, and the first input node; a first n-type device coupled to the first ground node, the other internal node, and the first input node; and a logic gate coupled to the internal node, the other internal node, the input node, and the output node.

In one embodiment, the logic gate is an inverter. In one embodiment, the logic gate is a complex logic gate. In one embodiment, the second driver comprises: a second p-type device coupled to the second input node, the interconnect, and the second power supply node; and a second n-type device coupled to the second input node, the interconnect, and the second ground node. In one embodiment, the first bypass device is a p-type device.

In another example, in one embodiment, an integrated circuit (IC) comprises: a first driver having stacked devices, the first driver operable on a first power supply and a first ground supply, the first driver to receive an input signal with a signal swing according to a second power supply and a second ground supply, the second power supply having a voltage level lower than a voltage level of the first power supply, and the second ground supply having a voltage level higher than a voltage level of the first ground supply; a second driver coupled to the first driver, the second driver operable on the second power supply and the second ground supply; and a pair of by-pass devices coupled to the first and second drivers, the pair of by-pass devices to provide the second power supply and the second ground supply according to an output of the first driver.

In one embodiment, the IC further comprises: an interconnect coupled to an output of the second driver. In one embodiment, the pair of by-pass devices comprises: a p-type device to provide the second power supply; and an n-type device to provide the second ground supply. In one embodiment, the first driver comprises: a first p-type device to receive the first power supply and the input signal; and a second p-type device coupled in series to the first p-type device, the second p-type device to receive the input signal and to provide a first output signal for controlling the p-type and n-type devices of the pair of by-pass devices.

In one embodiment, the first driver comprises: a first n-type device to receive the first ground supply and the input signal; and a second n-type device coupled in series to the first n-type device, the second n-type device to receive the input signal and to provide the first output signal for controlling the p-type and n-type devices of the pair of by-pass devices. In one embodiment, the pair of by-pass devices to adjust voltage levels of the second power supply and second ground supply according to an activity factor of the input signal. In one embodiment, the pair of by-pass devices to lower voltage level of the second power supply and to raise voltage level of the second ground supply as the activity factor of the input data signal increases. In one embodiment, the pair of by-pass devices to raise voltage level of the second power supply and to lower voltage level of the second ground supply as the activity factor of the input data signal decreases. In one embodiment, the first and second drivers are inverting drivers.

In another example, in one embodiment, a system comprises a memory; and a processor, coupled to the memory, the processor including a repeater, the repeater comprising: a first driver coupled to a first power supply node and a first ground node, the first driver having a first input node and a first output node, the first power supply node to have a first power supply and the first ground node to have a first ground supply; a second driver coupled to the first driver, the second driver having a second input node coupled to the first output node, and a second output node coupled to an interconnect; and a first bypass device coupled to the first output node and an internal node of the first driver, and to provide a second power supply on a second power supply node coupled to the second driver, the second power supply being lower than the first power supply.

In one embodiment, the system further comprises: a display unit; and a wireless interface for allowing the processor to communicate with another device. In one embodiment, the system further comprises: a second bypass device coupled to the first output node and another internal node of the first driver, and to provide a second ground supply on a ground supply node coupled to the second driver, the second ground supply being higher than the first ground supply.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first driver coupled to a first power supply node and a first ground node, the first driver having a first input node and a first output node, the first power supply node to have a first power supply, and the first ground node to have a first ground supply;
a second driver coupled to the first driver, the second driver having a second input node coupled to the first output node, and a second output node coupled to an interconnect; and
a first bypass device coupled to the first output node and an internal node of the first driver, and to provide a second power supply on a second power supply node coupled to the second driver, the second power supply being lower than the first power supply.

2. The apparatus of claim 1 further comprises:
a second bypass device coupled to the first output node and another internal node of the first driver, and to provide a second ground supply on a ground supply node coupled to the second driver, the second ground supply being higher than the first ground supply.

3. The apparatus of claim 2, wherein the second bypass device is an n-type device.

4. The apparatus of claim 2, wherein the first driver comprises:
   a first p-type device coupled to the first power supply node, the internal node, and the first input node;
   a first n-type device coupled to the first ground node, the other internal node, and the first input node; and
   a logic gate coupled to the internal node, the other internal node, the input node, and the output node.

5. The apparatus of claim 4, wherein the logic gate is an inverter.

6. The apparatus of claim 4, wherein the logic gate is a complex logic gate.

7. The apparatus of claim 2, wherein the second driver comprises:
   a second p-type device coupled to the second input node, the interconnect, and the second power supply node; and
   a second n-type device coupled to the second input node, the interconnect, and the second ground node.

8. The apparatus of claim 1, wherein the first bypass device is a p-type device.

9. An integrated circuit (IC) comprising:
   a first driver having stacked devices, the first driver operable on a first power supply and a first ground supply, the first driver to receive an input signal with a signal swing according to a second power supply and a second ground supply, the second power supply having a voltage level lower than a voltage level of the first power supply, and the second ground supply having a voltage level higher than a voltage level of the first ground supply;
   a second driver coupled to the first driver, the second driver operable on the second power supply and the second ground supply; and
   a pair of by-pass devices coupled to the first and second drivers, the pair of by-pass devices to provide the second power supply and the second ground supply according to an output of the first driver.

10. The IC of claim 9 further comprises:
    an interconnect coupled to an output of the second driver.

11. The IC of claim 9, wherein the pair of by-pass devices comprises:
    a p-type device to provide the second power supply; and
    an n-type device to provide the second ground supply.

12. The IC of claim 11, wherein the first driver comprises:
    a first p-type device to receive the first power supply and the input signal; and
    a second p-type device coupled in series to the first p-type device, the second p-type device to receive the input signal and to provide a first output signal for controlling the p-type and n-type devices of the pair of by-pass devices.

13. The IC of claim 11, wherein the first driver comprises:
    a first n-type device to receive the first ground supply and the input signal; and
    a second n-type device coupled in series to the first n-type device, the second n-type device to receive the input signal and to provide the first output signal for controlling the p-type and n-type devices of the pair of by-pass devices.

14. The IC of claim 9, wherein the pair of by-pass devices to adjust voltage levels of the second power supply and second ground supply according to an activity factor of the input signal.

15. The IC of claim 9, wherein the pair of by-pass devices to lower voltage level of the second power supply and to raise voltage level of the second ground supply as the activity factor of the input data signal increases.

16. The IC of claim 9, wherein the pair of by-pass devices to raise voltage level of the second power supply and to lower voltage level of the second ground supply as the activity factor of the input data signal decreases.

17. The IC of claim 9, wherein the first and second drivers are inverting drivers.

18. A system comprising:
    a memory; and
    a processor, coupled to the memory, the processor including a repeater, the repeater comprising:
       a first driver coupled to a first power supply node and a first ground node, the first driver having a first input node and a first output node, the first power supply node to have a first power supply, and the first ground node to have a first ground supply;
       a second driver coupled to the first driver, the second driver having a second input node coupled to the first output node, and a second output node coupled to an interconnect; and
       a first bypass device coupled to the first output node and an internal node of the first driver, and to provide a second power supply on a second power supply node coupled to the second driver, the second power supply being lower than the first power supply.

19. The system of claim 18 further comprises:
    a display unit; and
    a wireless interface for allowing the processor to communicate with another device.

20. The system of claim 18, further comprises:
    a second bypass device coupled to the first output node and another internal node of the first driver, and to provide a second ground supply on a ground supply node coupled to the second driver, the second ground supply being higher than the first ground supply.

* * * * *

UNITED STATES PATENT AND TRADEMARK OFFICE
CERTIFICATE OF CORRECTION

| | |
|---|---|
| PATENT NO. | : 8,847,633 B1 |
| APPLICATION NO. | : 13/791103 |
| DATED | : September 30, 2014 |
| INVENTOR(S) | : Kulkarni et al. |

It is certified that error appears in the above-identified patent and that said Letters Patent is hereby corrected as shown below:

Please insert in column 1, line 3 before BACKGROUND:

--STATEMENT OF GOVERNMENT INTEREST

This invention was made with Government support under contract number B600737 awarded by the Department of Energy. The Government has certain rights in this invention.--

Signed and Sealed this
Third Day of November, 2015

Michelle K. Lee
*Director of the United States Patent and Trademark Office*